United States Patent
Okino

(10) Patent No.: US 7,817,377 B2
(45) Date of Patent: Oct. 19, 2010

(54) ORIGINAL DISK FABRICATION METHOD, MAGNETIC RECORDING MEDIUM MANUFACTURING METHOD AND MAGNETIC RECORDING MEDIUM

(75) Inventor: Takeshi Okino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 244 days.

(21) Appl. No.: 12/031,972

(22) Filed: Feb. 15, 2008

(65) Prior Publication Data

US 2008/0204935 A1 Aug. 28, 2008

(30) Foreign Application Priority Data

Feb. 19, 2007 (JP) ............... 2007-038336

(51) Int. Cl.
*G11B 5/82* (2006.01)
(52) U.S. Cl. .................................... 360/135
(58) Field of Classification Search ............. 360/135, 360/48, 55, 69, 74.5, 74.6, 78.08
See application file for complete search history.

(56) References Cited

U.S. PATENT DOCUMENTS

| | | | | |
|---|---|---|---|---|
| 4,866,687 A | * | 9/1989 | Kasai et al. | 369/30.15 |
| 5,235,478 A | * | 8/1993 | Hoshimi et al. | 360/78.08 |
| 5,772,905 A | | 6/1998 | Chou | |
| 6,064,643 A | * | 5/2000 | Tanoue et al. | 369/275.3 |
| 6,359,844 B1 | * | 3/2002 | Frank | 369/32.01 |
| 6,817,562 B2 | * | 11/2004 | Evanoff et al. | 242/340 |

FOREIGN PATENT DOCUMENTS

| | | |
|---|---|---|
| JP | 2003-157520 | 5/2003 |
| JP | 2004-110896 | 4/2004 |
| JP | 2006-79827 | 3/2006 |
| JP | 3793040 | 4/2006 |

OTHER PUBLICATIONS

Office Action in Japanese Patent Application No. 2007-038336, dated Feb. 19, 2010, and English-language translation.

* cited by examiner

*Primary Examiner*—Fred Tzeng
(74) *Attorney, Agent, or Firm*—Nixon & Vanderhye, PC

(57) ABSTRACT

It is made possible to fabricate a bit-patterned magnetic recording medium having a high recording density and making favorable address deciphering possible. An original disk fabrication method for irradiating a photosensitive resin film with an electron beam to draw a pattern, the method includes: irradiating the electron beam by using a plurality of blanking signals every rotation of a stage per bit unit, when drawing the pattern in a part corresponding to an address part on a photosensitive resin film.

7 Claims, 10 Drawing Sheets

ORIGINAL DISK FABRICATION METHOD, MAGNETIC RECORDING MEDIUM MANUFACTURING METHOD AND MAGNETIC RECORDING MEDIUM

CROSS-REFERENCE TO RELATED APPLICATION

This application is based upon and claims the benefit of priority from prior Japanese Patent Application No. 2007-38336 filed on Feb. 19, 2007 in Japan, the entire contents of which are incorporated herein by reference.

BACKGROUND OF THE INVENTION

1. Field of the Invention

The present invention relates to an original disk fabrication method, a magnetic recording medium manufacturing method and a magnetic recording medium.

2. Related Art

In the technical trend toward the higher density of the magnetic disk (hereafter referred to as hard disk as well), a medium structure on which a magnetic part region issuing a magnetic signal is divided by nonmagnetic parts, i.e., the so-called medium structure of discrete type as described in JP-A 2004-110896 (KOKAI) is proposed. In additions a patterned medium on which a data track part is not only divided by grooves in the circumferential direction but also divided every data bit as described in IP-A 2006-79827 (KOKAI) is proposed. A method of forming dots by using self-organization of block copolymer and processing the dots is also proposed in IP-A 2006-79827 (KOKAI). Especially in the case of a wide area, however, it is considered to be difficult to control the atmosphere so as to arrange dots in good order As to this problem, it is proposed to use a guide as described in Japanese Patent No. 3793040. It is considered to be simple to form up to dot patterns by the electron beam lithography.

On the other hand, a technique of transferring a mold pattern having a size of 200 nm or less onto a film, called nano imprint lithography is described in U.S. Pat. No. 5,772,905. A technique of transferring a discrete-type magnetic disk pattern by using the imprint method is described in JP-A 2003-157520 (KOKAI). In JP-A 2003-157520 (KOKAI), it is described that a medium pattern is formed by using a stamper set up on the basis of an original disk which is fabricated by using the electron beam lithography technique. However, the electron beam lithography technique and the stamper pattern are not described.

In general, the magnetic disk apparatus includes within a casing, a magnetic disk taking the shape of a torus-shaped disk, a head slider including a magnetic head, a head suspension assembly which supports the head slider, a voice coil motor (VCM), and a circuit substrate.

The inside of the magnetic disk is divided into concentric tracks cut in round slices. Each of the tracks has sectors obtained by dividing the track every definite angle. The magnetic disk is attached to a spindle motor and rotated. Various digital data are recorded and reproduced by the magnetic head. Therefore, user data tracks are arranged in the circumference direction. On the other hand, servo marks for position control are arranged in a direction so as to stride across the tracks. Each servo mask includes regions such as a preamble part, an address part, and a burst part. Each servo mark includes a gap part besides these regions, in some cases. Each address part is provided with sector number information which changes in the circumference direction and track number information which changes in the radial direction.

As for a stamper original disk for fabricating a magnetic disk of discrete type or bit-patterned type by using the imprint system, it is desired to form both a user data track region (data part) and a servo region simultaneously. Otherwise, one of the regions is added later resulting in difficult positioning and complicated processes.

In fabricating the original disk, its pattern can be formed by exposing photosensitive resin to a chemical beam such as a mercury lamp, an ultraviolet beam, an electron beam and an x-ray beam. However, it is necessary to draw concentric circles. Therefore, the electron beam lithography with deflection added is desirable. Furthermore, it is necessary to couple fine patterns such as hard disk patterns having a track pitch of submicron order with good precision, Therefore, a scheme of moving the stage continuously is more desirable than the step-and-repeat scheme in which the stage is made to stand still when electron beam lithography is conducted and the stage is moved to the next field after all patterns in one field have been drawn.

It is desirable to use an electron beam irradiating apparatus of a continuous stage movement scheme including a moving mechanism to move the stage in one horizontal direction and a rotating mechanism to rotate the stage, from among electron beam irradiating apparatuses capable of drawing concentric circles. In this electron beam irradiating apparatus, a spot beam from one point on a movement axis is applied to the photosensitive resin on the substrate placed on the stage to conduct electron beam exposure. If any external force is not applied to the electron beam for deflection, the distance between the rotation center of the substrate and the electron beam irradiation position changes with time, and consequently a spiral shape is drawn. Therefore, concentric circles can be drawn by deflecting the electron beam while gradually changing the deflection strength (deflection quantity) every rotation in the electron beam exposure process. Here, it is not necessary to draw one track on one circumference, but one track may be formed by drawing on a plurality of circumferences. Because the pattern precision in the radial direction can be improved by doing so. It has a merit in pattern precision in that drawing is conducted with a fine beam diameter, to draw while deflecting the beam by a width of a bit pattern in the radial direction during a movement corresponding to one bit pattern in the circumferential direction when drawing one bit pattern. In general, however, the beam current value in the exposure spot cannot help being made as small as several to several hundreds pA, resulting in great demerit in mass production. It is desirable from the viewpoint of both mass production and pattern precision that the beam current value of an electron beam irradiating apparatus (hereafter referred to as EBR (Electron Beam Recorder) as well) which draws a hard disk pattern of submicron order is in the range of several nA to several tens nA.

When drawing a pattern in the circumference direction by using an EBR, it suffices to bring the beam into the ON state or the OFF state for a time corresponding to a desired length. When drawing a pattern in the radial direction, however, it is necessary to bring the beam into the ON state or the OFF state at a predetermined angle position every circumference.

When forming an original disk pattern of a magnetic disk by using such an electron beam irradiating apparatus, it is necessary to form the address part and other regions simultaneously as described above. As for the address part, however, it is necessary to form a pattern which changes according to its track position and sector position. Because the pattern on the original disk finally becomes the magnetic pattern on a magnetic recording medium and a magnetic signal of position information needs to be sensed in the address part on the magnetic disk. Therefore, it is desired that a signal corresponding to a pattern to be drawn in the address part is automatically calculated and output while it is being changed according to the pattern forming position, from an apparatus (which is hereafter referred to as signal source and also called formatter) for generating a signal which controls rotation, feeding and blanking of an electron beam irradiating apparatus to the electron beam irradiating apparatus.

In the magnetic disk, the bit length at a certain radius is obtained by the relation: the length of the circumference at the radius÷ the number of sectors per circumference÷ the number of bits per sector. The bit length is used to be constant in the address part, the data track part, and other areas. The conventional signal source let a beam go through to the substrate to be exposed, when the bit pattern to be drawn corresponds to bits to be exposed. When the bit pattern to be drawn corresponds to bits which should not be exposed, the conventional signal source applies blanking to prevent the beam from being output. Here, in the address part, both the magnetic part and the non-magnetic part can produce significant magnetic signals. However, the non-magnetic part in the data track part serves as a barrier for preventing magnetic parts from interfering each other, and the non-magnetic part itself has no meaning as a magnetic signal. If each of non-magnetic parts in the data track part in the radial direction is also provided with an area corresponding to one bit as in the conventional art, the recording density decreases to half and the meaning of the change from the conventional in-plane recording scheme to the patterned media scheme made aiming at an increase of the recording density is lost. If on the contrary the bit length is shortened to increase the recording density in the address part as well, deciphering is affected, resulting in operation troubles of the hard disk.

SUMMARY OF THE INVENTION

An object of the present invention is to provide a fabrication method of an original disk on which the recording density is high and favorable address deciphering is possible when fabricating a pattern of a patterned medium on which a data track area is divided by non-magnetic parts, by using an electron beam irradiating apparatus, and provide such a magnetic recording medium and its manufacturing method.

According to a first aspect of the present invention, there is provided an original disk fabrication method for irradiating a photosensitive resin film with an electron beam to draw a pattern and fabricating a stamper to be used to form a pattern on a magnetic recording medium, the electron beam irradiating apparatus including a rotating mechanism configured to rotate a stage on which a substrate is placed, and a blanking drive part configured to control blanking of the electron beam, the method including: irradiating the electron beam by using a plurality of blanking signals every rotation of the stage per bit unit, when drawing the pattern in a part corresponding to an address part on the photosensitive resin film.

According to a second aspect of the present invention, there is provided an original disk fabrication method for irradiating a photosensitive resin film with an electron beam to draw a pattern by means of an electron beam irradiating apparatus and fabricating a stamper to be used to form a pattern on a magnetic recording medium including at least an address part and a data part, the electron beam irradiating apparatus including a rotating mechanism which rotates a stage on which a substrate is placed, and a blanking drive part which controls blanking of the electron beam, the method including: drawing a pattern in each of the address part and the data part so that one signal output unit of ON/OFF of the blanking signal in a region corresponding to the address part is made in pattern drawing larger than one signal output unit in a region corresponding to the data part, when the calculation processing apparatus accompanying a blanking signal source calculates blanking signal output.

According to a third aspect of the present invention, there is provided a magnetic recording medium of patterned media type including: a data part divided in a concentric circle form; and an address part arranged so as to stride across the data part, wherein a line pitch of the lines in a radial direction in the data part is shorter than a line pitch of the lines in the radial direction in the address part.

According to a fourth aspect of the present invention, there is provided a magnetic recording medium of patterned media type including: a data part arranged in a concentric circle form; and an address part arranged so as to stride across the data part, wherein a pattern width of a non-magnetic line in a radial direction in the data part is shorter than a pattern width of a non-magnetic line in the radial direction in the address part.

According to a fifth aspect of the present invention, there is provided a manufacturing method of a magnetic recording medium including: fabricating an original disk by using an original disk fabrication method according to the first aspect, and manufacturing a magnetic recording medium by using the original disk.

BRIEF DESCRIPTION OF THE DRAWINGS

FIGS. 5(a) and 5(b) are diagrams showing a pattern of a magnetic recording medium fabricated by using an original disk obtained by using the method of a comparative example;

FIGS. 5A to 5F are sectional views showing manufacturing processes of a magnetic recording medium according to a second embodiment;

DETAILED DESCRIPTION OF THE INVENTION

First Embodiment

A fabrication method of an original disk according to a first embodiment of the present invention will now be described with reference to FIGS. 1(a) to 7.

Figure 1:
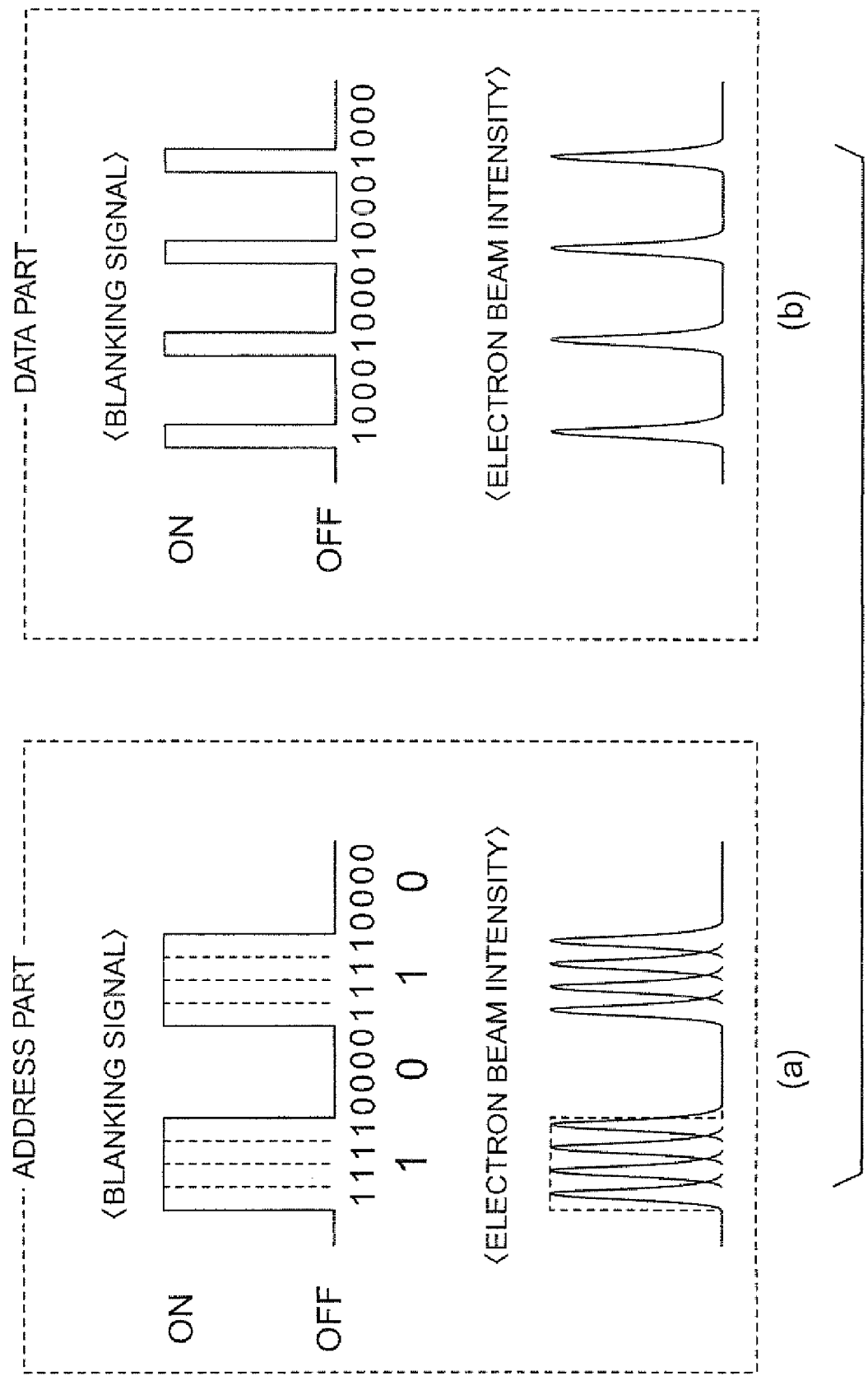
FIG. 1(a) and 1(b) are diagrams showing waveforms of a blanking signal and an electron beam in an original disk fabrication method according to a first example.
Figure 2:
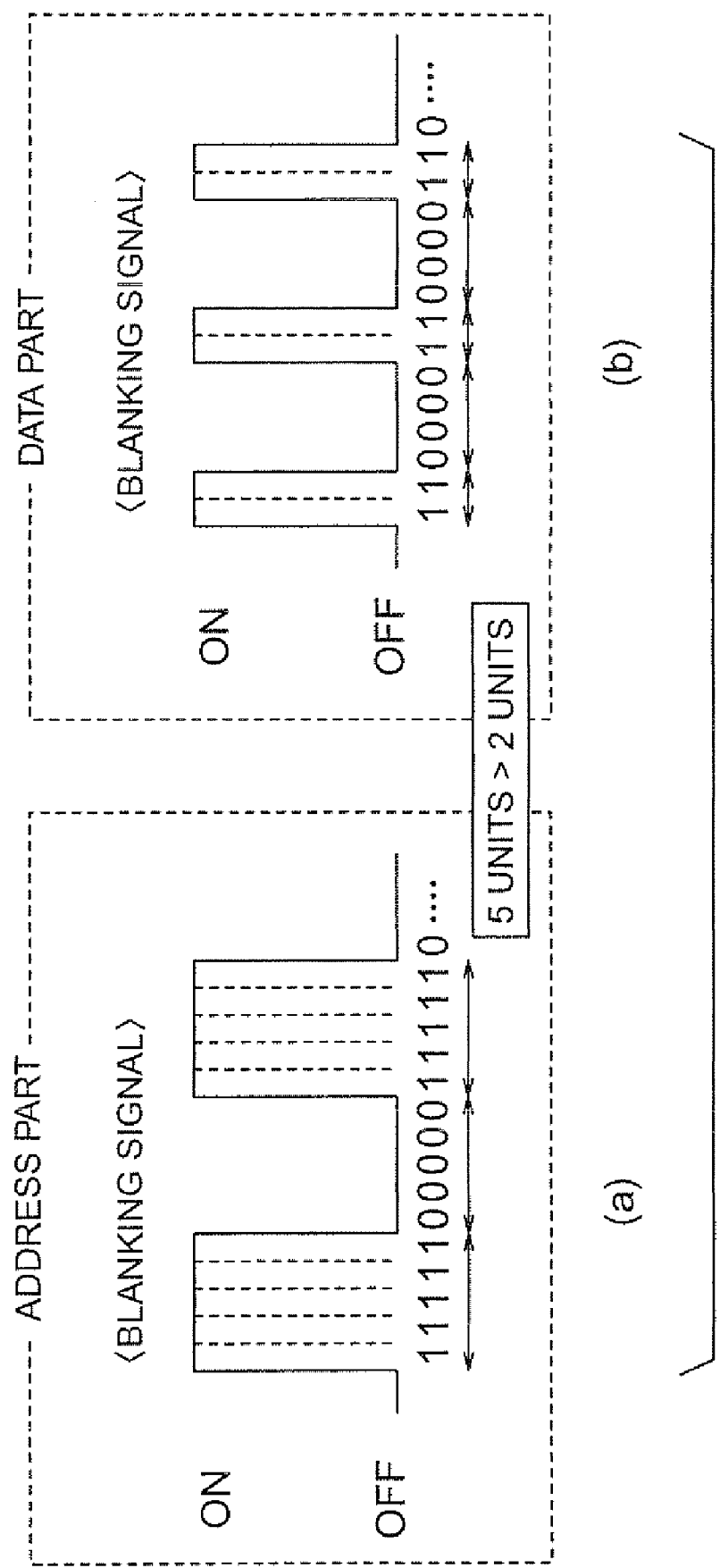
FIGS. 2(a) and 2(b) are diagrams showing waveforms of a blanking signal and an electron beam in an original disk fabrication method according to a second example.
Figure 3:
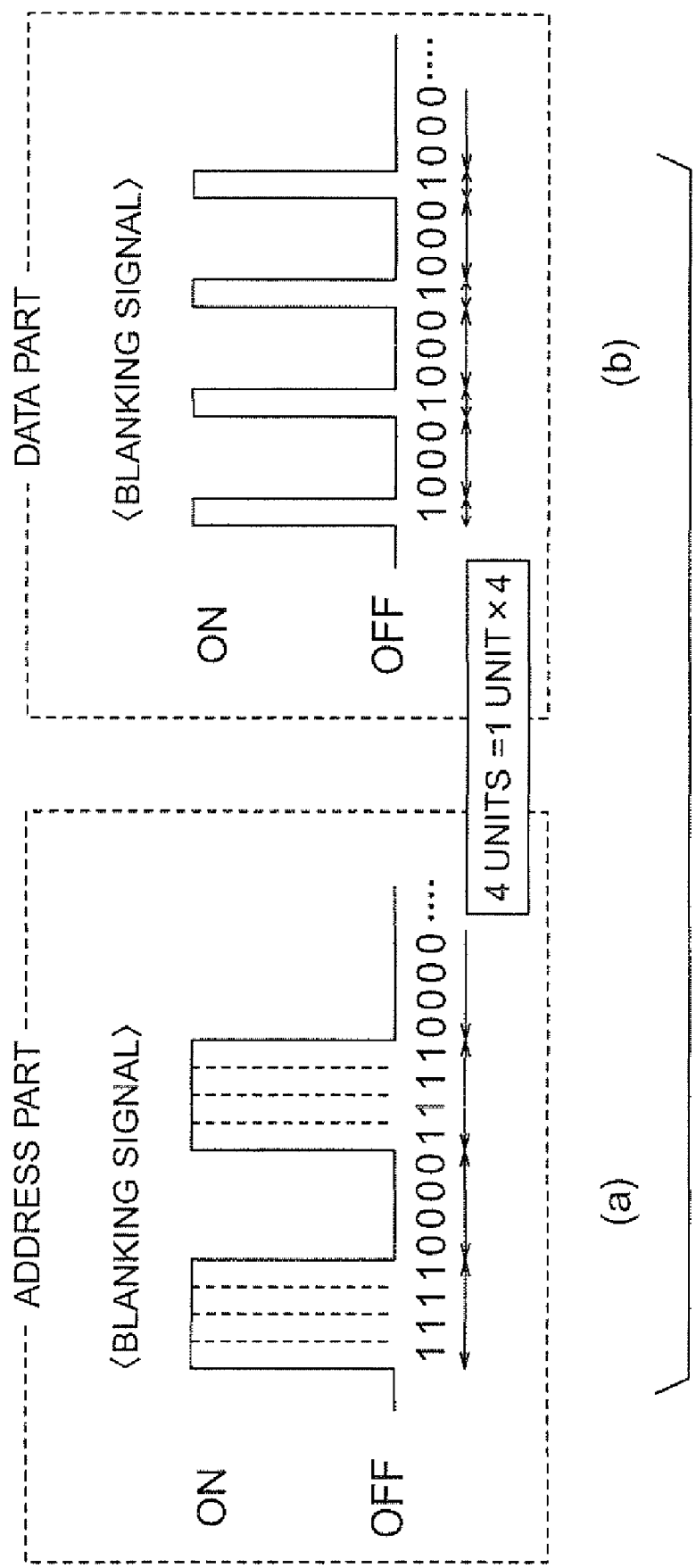
FIGS. 3(a) and 3(b) are diagrams showing waveforms of a blanking signal and an electron beam in an original disk fabrication method according to a third example.
Figure 4:
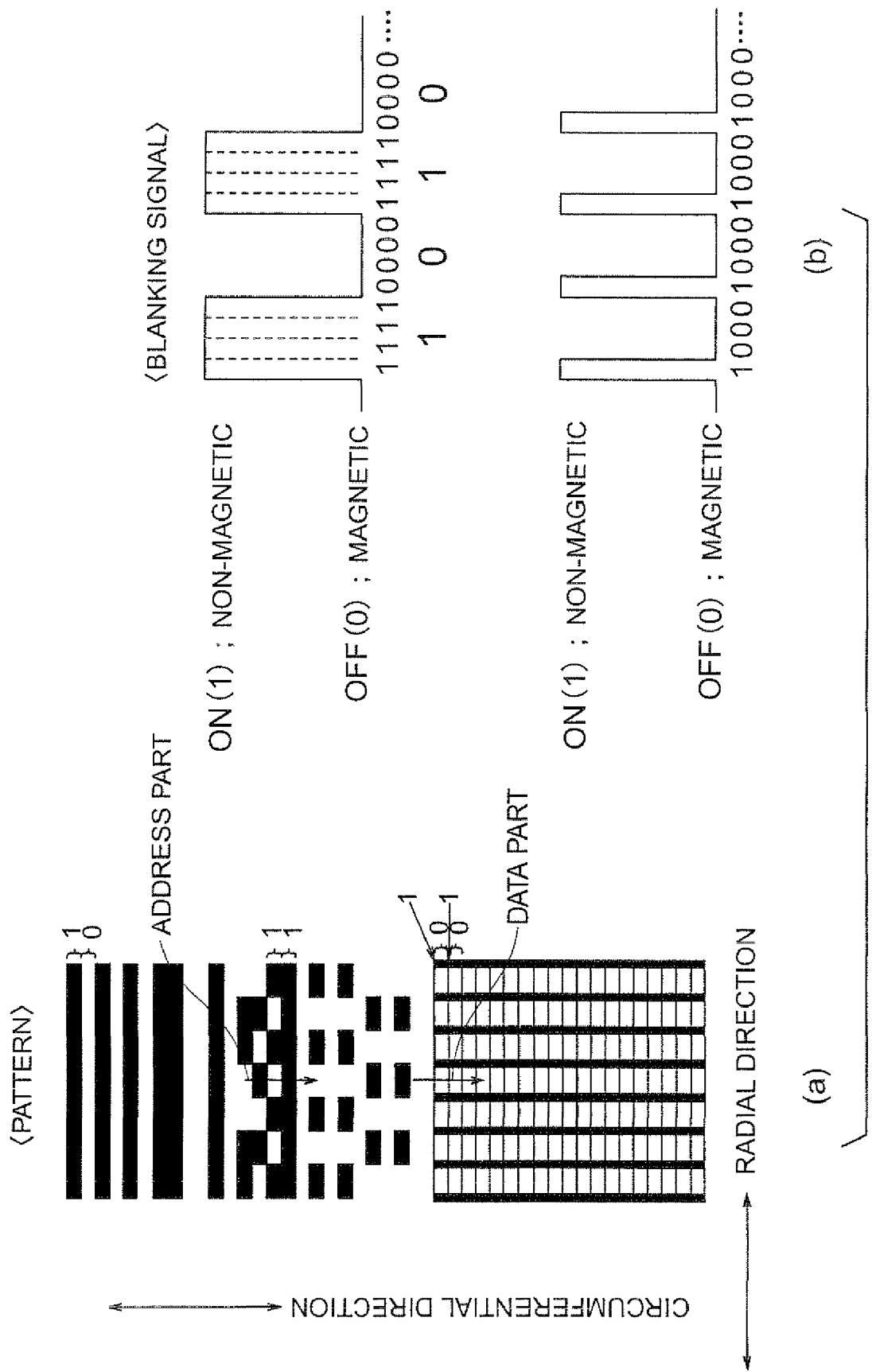
FIGS. 4(a) and 4(b) are diagrams showing a pattern of a magnetic recording medium fabricated by using an original disk obtained by using the method of the first embodiment.
Figure 5:
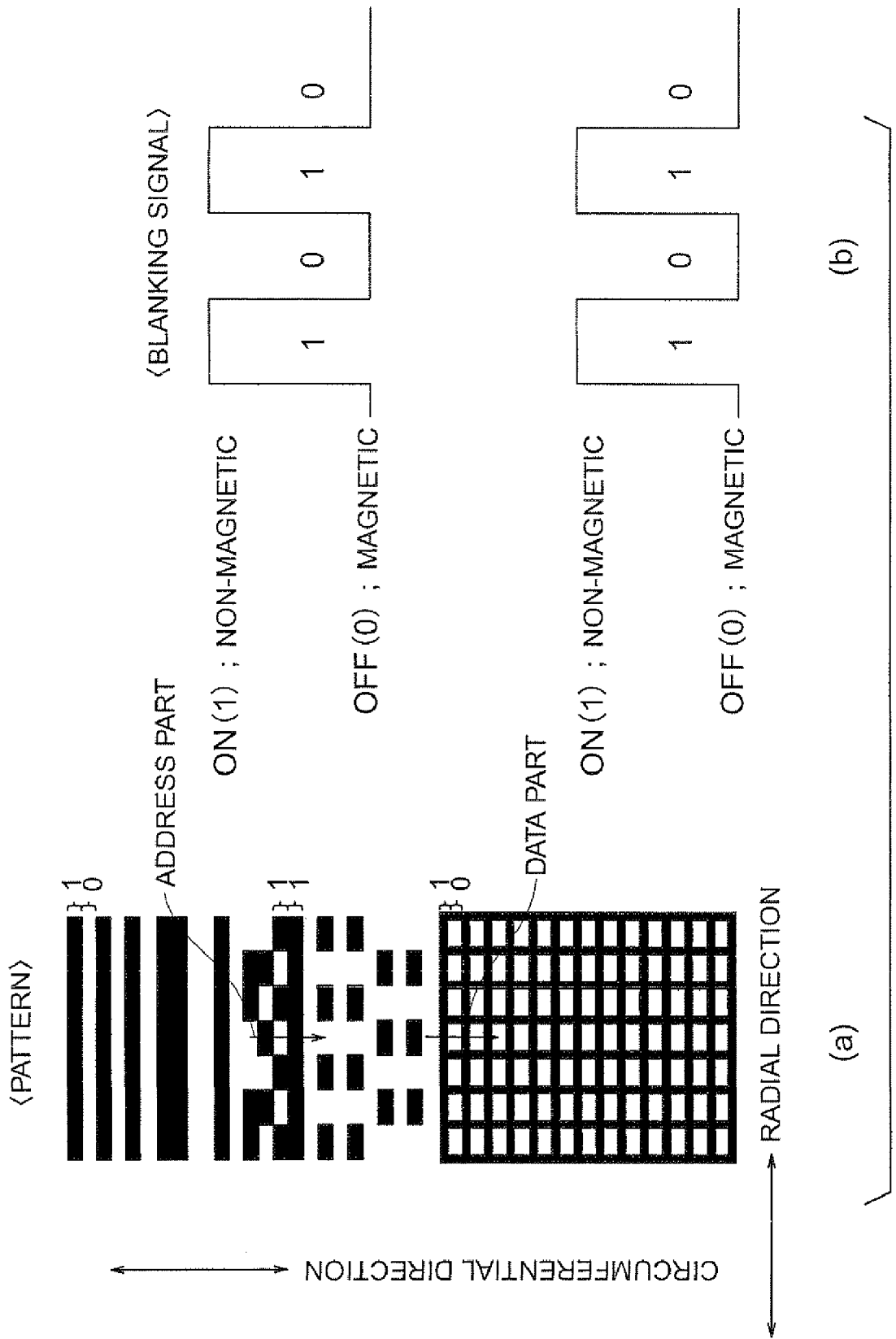
Figure 6:
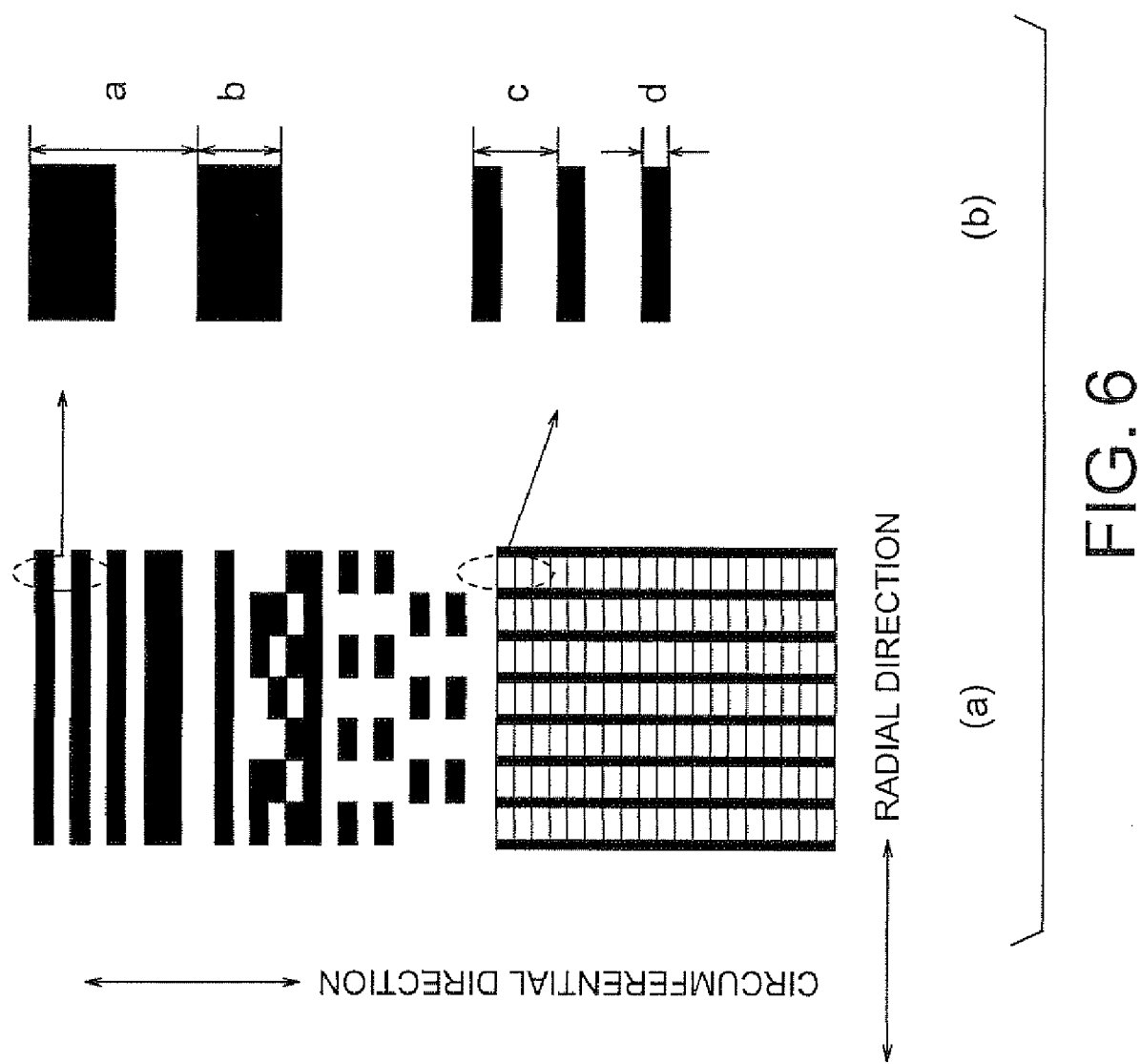
FIG. 6(a) and FIG. 6(b) are diagrams for explaining an effect of the fabrication method according to the first embodiment.
Figure 7:
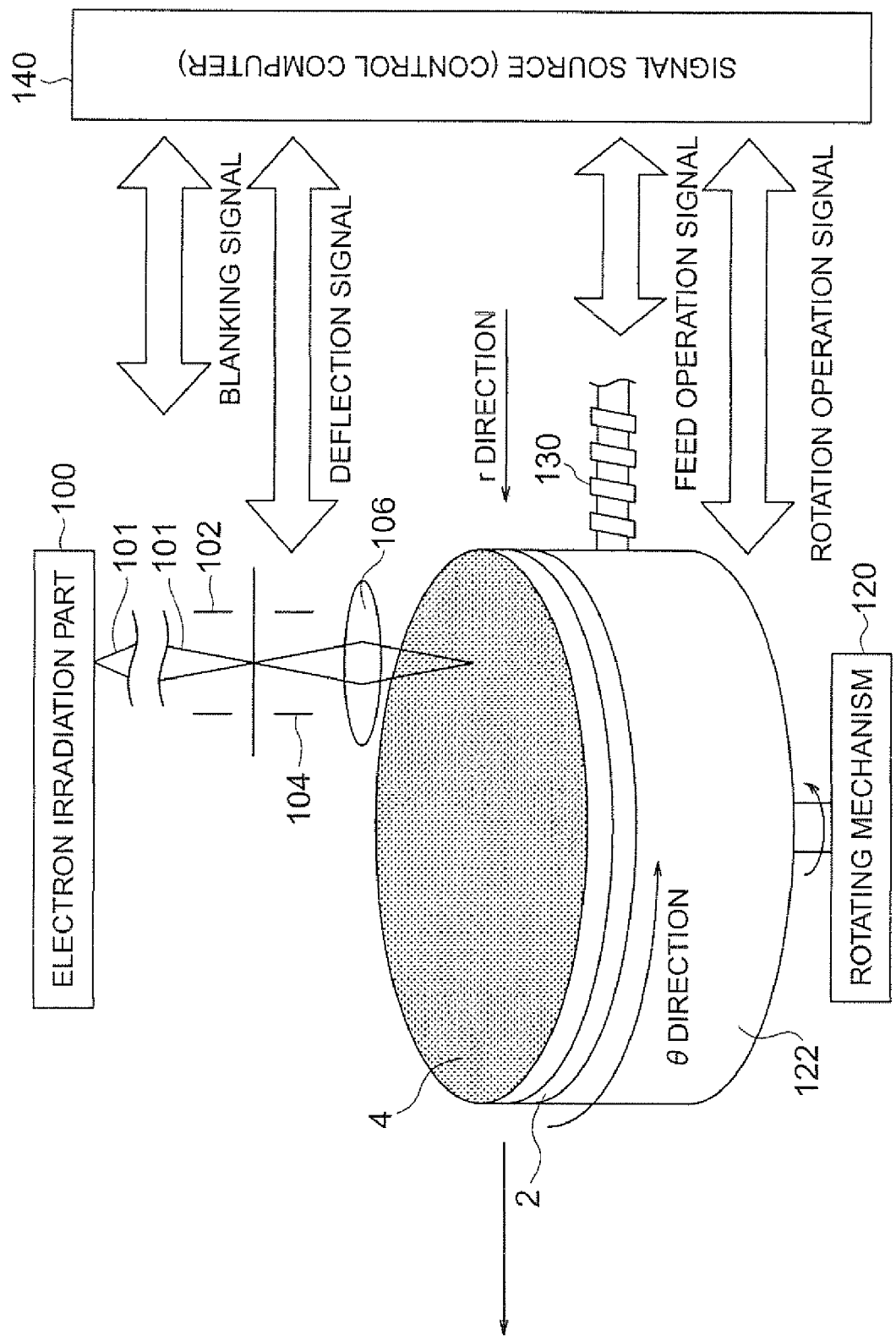
FIG. 7 is a diagram showing an outline of an electron beam irradiating apparatus used in the fabrication method according to the first embodiment.

FIG. 7 is a diagram showing a schematic configuration of an electron beam irradiating apparatus used in the fabrication method of the original disk according to the present embodiment. This electron beam irradiating apparatus includes a rotating mechanism 120 to rotate a stage 122 on which a substrate 2 having a photosensitive resin film 4 formed thereon is placed, a moving mechanism 130 to move the stage 122 in one horizontal direction, and an electron beam irradiation part 100 to irradiate the photosensitive resin film 4 with an electron beam 101. The place through which the electron beam 101 passes is kept in the vacuum state. The electron beam 101 emitted from the electron beam irradiation part 100 passes through a lens system including a condenser lens and an object lens 106 and arrives at the photosensitive resin film 4. During that time, the electron beam 101 passes through between blanking electrodes operated by a blanking drive part 102. Besides, the beam optical path may include an aperture. At least the rotating mechanism 120, the moving mechanism 130 and the blanking drive part 102 are coupled to a signal source 140 having a control computer and controlled thereby. In addition, a deflection drive part 104 may also be coupled to the signal source 140 and controlled thereby in the same way. A mechanism used to feed back an error of the stage 122 operated by the rotating mechanism 120 and the moving mechanism 130 and correct the error on the signal source 140 side may also be provided.

When the rotating mechanism 120, moving mechanism 130, the blanking drive part 102 and the deflection drive part 104 are controlled by the signal source 140, signals supplied from the signal source 140 include 1) a blanking signal, 2) a deflection signal for obtaining a desired pattern such as concentric circles, 3) a feed operation signal to the radial direction, and 4) a rotation operation signal.

When drawing a pattern by irradiating the photosensitive resin film 4 with an electron beam, the width of the blanking signal, that is, the time length of the blanking signal is changed according to whether the region is a region corresponding to the address part or a region corresponding to the data part, in the fabrication method of the original disk according to the present embodiment. Its concrete example will now be described as first to third examples.

FIRST EXAMPLE

When, in a first example, drawing a pattern in a region of the photosensitive resin film 4 corresponding to the address part of the magnetic recording medium with an electron beam, drawing is conducted by using a plurality of (four in FIG. 1(a)) blanking signals per bit unit as shown in FIG. 1(a) every rotation of the stage 122. At this time, electron beams respectively corresponding to the blanking signals may overlap as indicated by dotted lines in a lower part of FIG. 1(a), or may not overlap. On the other hand, when drawing a pattern in a region corresponding to the data part, the pattern may be drawn by using one blanking signal per bit unit as shown in FIG. 1(b). In that case, an electron beam corresponding to a blanking signal also becomes isolated one.

SECOND EXAMPLE

When, in a second example, calculating outputs of the blanking signals for drawing patterns in the address part and the data part in a calculation processing apparatus accompanying the signal source 140, one signal output unit of ON and OFF of the blanking signal in the address part is made larger than one signal output unit of ON and OFF of the blanking signal in the data part as shown in FIGS. 2(a) and 2(b). For example, one signal output unit is five units in the address part as shown in FIG. 2(a), and one signal output unit is two units in the data part as shown in FIG. 2(b). At this time, the electron beam used to irradiate the region corresponding to the address part may be an electron beam corresponding to each of the five blanking signals, or may be overlapping electron beams corresponding to the five blanking signals as a whole as described with reference to the first example.

THIRD EXAMPLE

A third example is obtained by making one signal output unit of ON and OFF of the blanking signal in the address part in the second example equal to a plurality of times as long as one signal output unit of the blanking signal in the data part as shown in FIGS. 3(a) and 3(b). For example, one signal output unit of the blanking signal in the data part is made equal to one unit as shown in FIG. 3(b), whereas one signal output unit of the blanking signal in the address part is made equal to four units as shown in FIG. 3(a). At this time, the electron beam used to irradiate the region corresponding to the address part may be an electron beam corresponding to each of the four blanking signals, or may be overlapping electron beams corresponding to the four blanking signals as a whole as described with reference to the first example.

When drawing a pattern by irradiating the photosensitive resin film 4 with an electron beam, an original disk is fabricated by changing the width of the blanking signal according to whether the region is a region corresponding to the address part or a region corresponding to the data part, as described with reference to the first to third examples. If a magnetic recording medium of patterned media type is manufactured by using such an original disk, a pattern composed of non-magnetic parts (represented by black colors) and magnetic parts (represented by white colors) is obtained as shown in FIG. 4(a). FIG. 4(b) shows blanking signals used to obtain patterns indicated by arrows in FIG. 4(a). As appreciated from FIG. 4(a), patterns in the non-magnetic parts in the track part are finer as compared with the address part. In particular, the length (width) in the circumferential direction is narrow. Therefore, the area of the magnetic parts in the data part becomes relatively large, and the recording density can be improved. By the way, comparison of the length (width) in the circumferential direction is conducted under the condition of the same radius.

As a comparative example, an original disk is fabricated so as not to change the width of the blanking signal according to whether the region is a region corresponding to the address part or a region corresponding to the data part as shown in FIG. 5(b). If a magnetic recording medium of patterned media type is manufactured by using the original disk of the comparative example, a pattern composed of non-magnetic parts (represented by black colors) and magnetic parts (represented by white colors) as shown in FIG. 5(a) is obtained. As appreciated from FIG. 5(a), the length (width) in the circumferential direction in the address part is made the same as that in the track part. Therefore, the area of the magnetic parts in the data part is small as compared with the case where the method according to the present embodiment is used and recording density is small. In addition, the reproduced signal is small and the S/N ratio is aggravated.

If a magnetic recording medium of pattern media type is manufactured using an original disk fabricated by using the method according to the present embodiment, it becomes possible to make a line pitch "c" in the track part on the magnetic recording medium shorter than a line pitch "a" in the address part as shown in FIGS. 6(a) and 6(b). In the address part, therefore, a sufficient magnetic signal can be provided with a comparatively long bit length. In the data part, the recording density can be increased. By the way, comparison of the line pitch of the lines in the radial direction is conducted under the condition of the same radius.

In addition, it becomes possible at this time to make the line pitch "c" in the track part on the magnetic recording medium equal to half of the line pitch "a" in the address part. In the address part, therefore, patterns in the magnetic part and the non-magnetic part each corresponding to one bit length are obtained as significant magnetic signals. On the other hand, in the data part, it is possible to cause a non-magnetic pattern serving as a bit barrier and a magnetic pattern which can become a magnetic signal of the bit to have a combined length of one bit. In the address part, a sufficient magnetic signal can be provided with a comparatively long bit length. In the data area part, it becomes possible to increase the recording density to twice as compared with the case where the each of the non-magnetic pattern and the magnetic pattern is provided with one bit length.

If a magnetic recording medium of pattern media type is manufactured using an original disk fabricated by using the method according to the present embodiment, it becomes possible to make a line pattern width "d" of a non-magnetic part in the track part on the magnetic recording medium shorter than a line pattern width "b" of a non-magnetic part in the address part as shown in FIGS. 6(a) and 6(b). In the data part, therefore, it is possible to secure an area for obtaining a magnetic signal of a bit while providing a line pattern of a non-magnetic part having a function of partitioning bits. By the way, comparison of the line pattern width of the line in the radial direction is conducted under the condition of the same radius.

If a magnetic recording medium is manufactured by using an original disk fabrication method according to the first to third example, manufacture of the magnetic recording medium becomes simple and it is favorable.

In the address part, track and sector position information needs to be represented as a magnetic pattern on the magnetic recording medium. The track and sector position information can be represented as a magnetic pattern on the magnetic recording medium by, for example, assigning a number with a certain position taken as reference, converting the number to a binary number, turning ON/OFF blanking of the electron beam (for example, turning ON for 1 and turning OFF for 0), and finally implementing patterns composed of the magnetic parts and the non-magnetic parts.

As for the unit of the signal output, a length in the circumferential direction at the same radial position or time over which the electron beam is turned ON or OFF to draw a pattern in the circumferential direction can be used.

By the way, the magnetic recording medium of patterned media type refers to a magnetic recording medium on which spots having magnetic particles are separated by a non-magnetic material and arranged to reduce magnetic interaction between magnetic particles, reduce medium noise and improve the recording density.

The photosensitive resin used in the original disk fabrication method according to the present embodiment may be either of a positive type resist, a negative type resist, a chemical amplifier type containing a material which generates acid in response to exposure (hereafter referred to as acid generation material), and a non-chemical amplifier type. However, the positive type resist of the non-chemical amplifier type is favorable because it is favorable in sensitivity to the electron beam, stable and favorable in resolution as well. Besides, a material containing PMMA (polymethyl methacrylate) or novolac resin as a main component can be used. The dry etching resistance is not always necessary.

The exposure may be started from either of the inner circumference side and the outer circumference side. Or the exposure may be conducted by dividing the region into several zones. It can be accomplished to form the OFF state during the exposure of the region corresponding to the bit pattern by supplying a deflection signal so as to blank the electron beam in the electron beam irradiating apparatus.

According to the present embodiment, it is possible to obtain an original disk which is high in recording density and favorable in address deciphering when fabricating a pattern of a patterned medium on which a data track area is partitioned by non-magnetic parts every bit by using an electron beam irradiating apparatus.

Second Embodiment

A magnetic recording medium according to a second embodiment of the present invention will now be described with reference to FIGS. 8A to 9F. The magnetic recording medium according to the present embodiment is a magnetic bit-patterned recording medium of magnetic substance-patterned type. When manufacturing it, the electron beam lithography method described with reference to the first embodiment is used in the exposure process. Hereafter, the manufacturing process of the magnetic recording medium according to the present embodiment will be described.

Figure 8A:
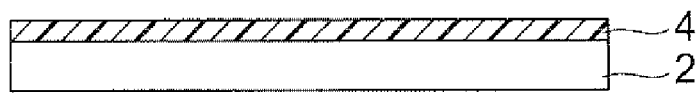

Photosensitive resin (hereafter referred to as resist) 4 is applied onto a substrate 2 (see FIG. 8A). The resist 4 is exposed to an electron beam as shown in FIG. 8B.

Figure 8B:
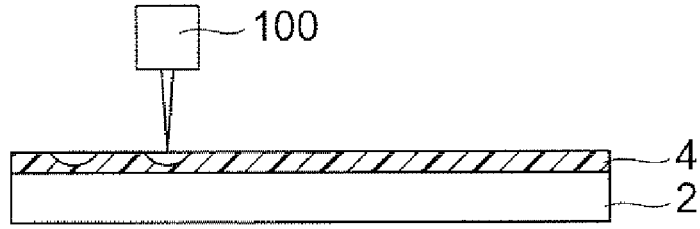
Figure 8C:
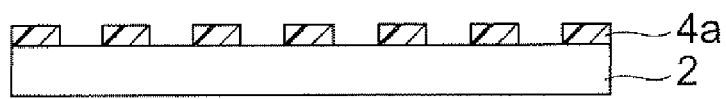
Figure 8D:
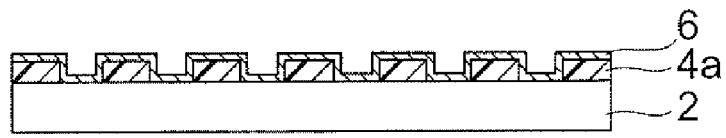

Thereafter, the resist 4 is developed by using a developing solution to form a resist pattern 4a (FIG. 8B shows the case where a positive type resist is used). A resist original disk is fabricated (see FIG. 5C). A post-bake process may be executed before developing the resist 4.

Subsequently, a thin conductive film 6 is formed on the resist pattern 4a of the resist original disk by conducting Ni sputtering or the like (see FIG. 5D). At this time, the resist pattern 4a is made thick enough to maintain the shape of concave parts of the resist pattern 4a. Thereafter, a Ni film 8 is buried fully in the concave parts of the resist pattern 4a by electroforming and formed to have a desired thickness (see FIG. 8E).

Subsequently, the Ni film 8 is stripped from the resist original disk formed of the resist 4a and the substrate 2. As a result, a stamper 30 formed of the conductive film 6 and the Ni film 8 is formed (see FIG. 8F). Thereafter, oxygen RIE (reactive ion etching) is conducted to remove the resist adhered to the stamper 30 (not illustrated).

Figure 9A:
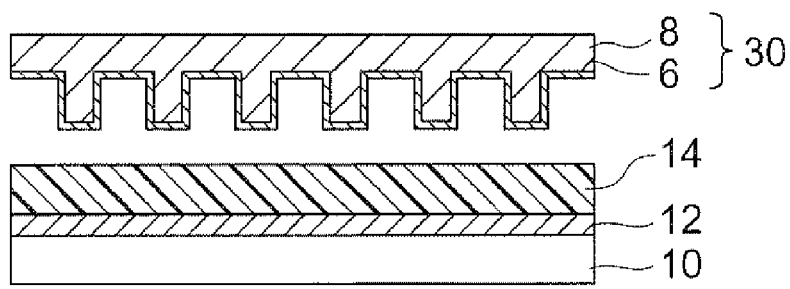
FIGS. 9A to 9F are sectional views showing manufacturing processes of a magnetic recording medium according to the second embodiment.
Figure 9B:
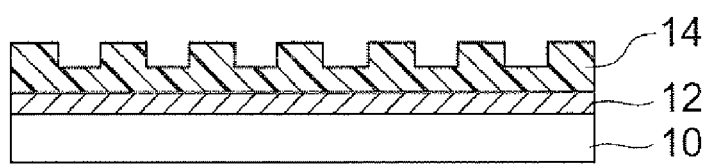

As shown in FIG. 9A, a magnetic layer 12 serving as a recording layer is formed on a substrate 10. A magnetic recording medium substrate obtained by applying resist 14 onto the magnetic layer 12 is prepared. The resist 14 applied onto the magnetic recording medium substrate is imprinted by using the stamper 30 (see FIG. 9A). Thus, the pattern of the stamper 30 is transferred onto the resist 14 (see FIG. 9B).

Subsequently, the resist 14 is etched by using the pattern transferred onto the resist 14 as a mask. As a result, a resist pattern 14a is formed (see FIG. 9C). Thereafter, the magnetic layer 12 is subjected to ion milling by using the resist pattern 14a as a mask (see FIG. 9D). Subsequently, the resist pattern 14a is removed by dry etching or chemicals. As a result, a discrete magnetic layer 12a is formed (see FIG. 9E).

Subsequently, a protection film 16 is formed on the whole surface to complete the magnetic recording medium (see FIG.

9F). A process for burying a nonmagnetic material into concave parts such as grooves may be provided.

Although the shape of the substrate on which the pattern is formed by using the manufacturing method according to the present embodiment is not especially restricted, a substrate taking the shape of a disk such as a silicon wafer is desirable. The disk may have a notch or an orientation flat. As the substrate, a glass substrate, an Al alloy substrate, a ceramic substrate, a carbon substrate, a compound semiconductor substrate or the like can be used. As the glass substrate, amorphous glass or crystallized glass can be used. As the amorphous glass, soda lime glass, aluminosilicate glass, or the like can be used. As the crystallized glass, there is lithium crystallized glass. As the ceramic substrate, a sintered body containing aluminum oxide, aluminum nitride, silicon nitride or the like as the main component, or substrates obtained by fiber-reinforcing these sintered bodies can be used. As the compound semiconductor substrate, GaAs, AlGaAs or the like is used.

As for the magnetic recording medium shape, a disk shape, especially the torus-shape is favorable from the viewpoint of the scheme. However, its size is not especially restricted from the viewpoint of the scheme. However, its size is desired to be 3.5 inch or less so as to prevent the time of drawing with the electron beam from becoming excessively long. In addition, its size is desired to be 2.5 inch or less so as to prevent the press capability used at the time of imprinting from becoming excessively large. From the viewpoint of mass productivity, it is more desirable that the size is 1.8 inch or less, such as 0.85 inch, 1 inch or 1.8 inch, at which the electron beam lithography time is relatively short and a relatively low pressure can be used at the time of imprinting Either of one side and both sides may be used as the magnetic recording medium.

The inside of the magnetic disk medium is divided into concentric tracks cut in round slices. Each of the tracks includes sectors obtained by dividing the track at every definite angle. The magnetic disk is attached to a spindle motor and rotated. Various digital data are recorded and reproduced by the magnetic head. Therefore, user data tracks are disposed in the circumferential direction. On the other hand, servo marks for position control are disposed in a direction striding over tracks. Each servo mark includes regions such as a preamble part, an address part having track or sector number information written therein, and a burst part used to detect the relative position of the head to the track. Each servo mark includes a gap part besides the regions in some cases.

From the viewpoint of improvement in recording density, the track pitch is required to be narrower. Even in one track, it is necessary to form a nonmagnetic part serving as a separation part for a user data region part and a magnetic part serving as a data recording region, form address bits in a corresponding servo region, and form burst marks. At the time of cutting, therefore, it is required to conduct lithography so as to form one track with several to several tens circumferences. If the number of cutting circumferences is small, then the shape resolution becomes low and it becomes impossible to reflect the pattern shape favorably. If the number of cutting circumferences is large, there is a problem that the control signals become complicated and become large in capacity. Therefore, it is desirable that one track is formed of circumferences numbering in the range of six to thirty-six inclusive. In addition, it is advantageous in the design of the pattern arrangement that the number of circumferences has a large number of divisors.

Since the sensitivity of the exposed film is typically uniform in the plane, it is desirable to rotate the stage in the electron beam irradiating apparatus while keeping the linear velocity constant. For example, if it is attempted to form one track with cutting of twenty circumferences when tracks in one user data region have a pitch of 200 nm, the cutting track pitch becomes 200÷20=10 nm. It is desirable that the cutting track pitch is at most the beam diameter in order to eliminate an insufficient exposure area or an undeveloped area.

As for the stage in the electron beam irradiating apparatus, an optical system for scanning with an electron beam, and signals for activating them, it is necessary to accomplish synchronization among the blanking point, its signal and stage operation signals for controlling movement in the radial direction and the rotation direction.

The stamper used to manufacture the magnetic disk medium according to the present embodiment may take the shape of a disk, a torus shape or another shape. It is desirable that the stamper has a thickness in the range of 0.1 mm to 2 mm inclusive. If the stamper is too thick, the strength is not obtained. If the stamper is thicker than needed, it takes time to conduct electroforming or the film thickness difference becomes large. It is desirable that the stamper is larger in size than the medium. However, the stamper size is not especially restricted from the scheme.

Figure 9C:
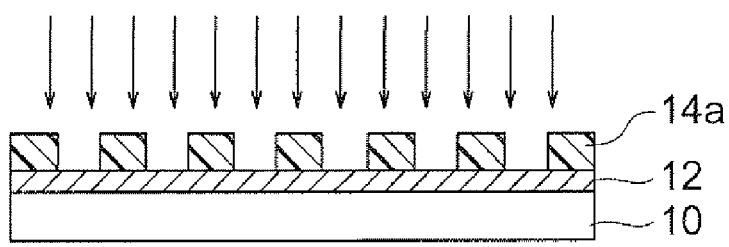
Figure 9D:
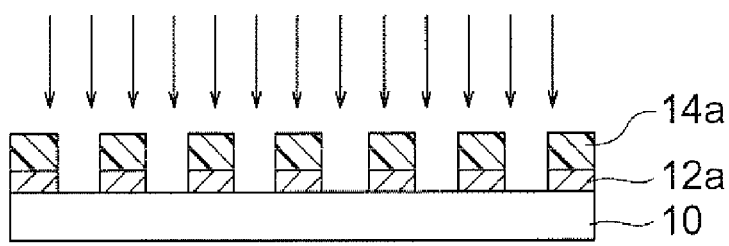
Figure 9E:
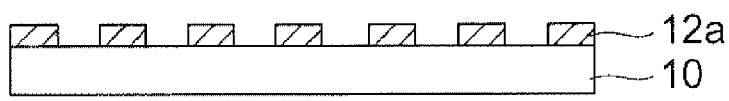
Figure 9F:
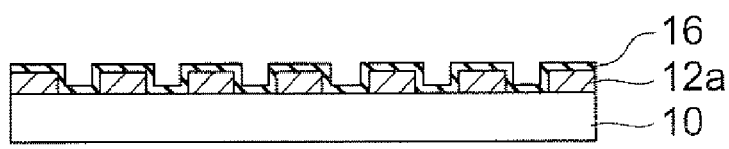

The magnetic recording medium according to the second embodiment is a magnetic bit-patterned recording medium of magnetic substance-patterned type as shown in FIG. 9F. Alternatively, the magnetic recording medium may be a magnetic bit-patterned recording medium of substrate-patterned type as shown in FIGS. 10A to 10D described later. In the exposure process for manufacturing the magnetic bit-patterned recording medium of substrate-patterned type, the electron beam lithography method described with reference to the first embodiment is used.

Examples of the present invention will now be described.

FIRST EXAMPLE

A magnetic recording medium according to a first example of the present invention will now be described with reference to FIGS. 8A to 9F.

An electron beam irradiating apparatus with an acceleration voltage of 50 kV having an electron gun emitter of ZrO/W thermal electric field emission type including an electron gun, a condenser lens, an object lens, a blanking electrode and a deflector was used.

On the other hand, resist ZEP-520 produced by NIPPON ZEON CORP, was diluted to twice with anisole, and filtered by using a 0.2-μm membrane filter. Thereafter, an 8-inch silicon wafer substrate 2 subjected to HMDS processing was spin-coated, and pre-baked at 200° C. for three minutes to form a resist 4 having a film thickness of 0.06 μm (see FIG. 8A).

The substrate 2 was conveyed to a predetermined position in the electron beam irradiating apparatus by a conveyance system in the apparatus. In vacuum, exposure was conducted to obtain a concentric circle pattern under the following conditions (see FIG. 8B).

Exposed part radius: 4.8 mm to 10.2 mm
Number of sectors per track: 150
Number of bits per sector: 4000
Track pitch: 200 nm
Feed quantity per rotation: 10 nm
The number of exposure circumferences per track: 20 circumferences
Linear velocity: 1 m/sec (constant)

Concentric circles were drawn while gradually increasing the deflection strength during one rotation.

The address part included a preamble pattern, a burst pattern, a sector and track address pattern, and a gap pattern. A track part occupies an area which amounts to 90% of the sector. As for the address part, blanking signals were generated automatically by the calculation processing apparatus accompanying the signal source so as to form a pattern obtained by coding an address number according to the position. At this time, calculation for one bit in the address part was conducted by taking four as one unit. In the data track part, one bit was formed by generating one unit as a signal associated with the non-magnetic pattern and three units as a signal associated with the magnetic pattern.

As for a signal for forming the pattern, a signal to be sent to a stage drive system in the exposure apparatus, and the electron beam deflection control, a signal source capable of generating them in synchronism was used.

After the exposure, the silicon wafer substrate 2 was immersed in a developing solution (for example, ZED-N50 (produced by NIPPON ZEON CORP.) for 90 seconds and developed. Thereafter, the silicon wafer substrate 2 was immersed in a rinse solution (for example, ZMD-B (produced by NIPPON ZEON CORP.) for 90 seconds and rinsed. The silicon wafer substrate 2 was dried by air blow, and a resist original disk having the uneven resist pattern 4a could be fabricated (see FIG. 8C).

A conductive film 6 was formed on the resist original disk by using the sputtering method. Pure nickel is used as the target. Then, sputtering was conducted in a chamber which is vacuumed up to $8 \times 10^{-3}$ Pa, filled with argon gas and adjusted to 1 Pa, with DC power of 400 W for 40 seconds. As a result, a conductive film 6 of 30 nm was obtained (see FIG. 8D).

Figure 8E:
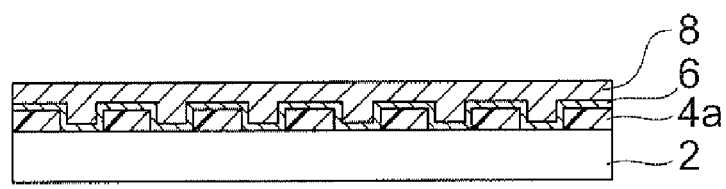
Figure 8F:
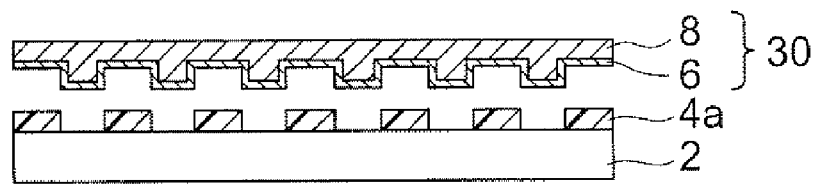

The resist original disk having the conductive film 6 is electroformed by using a nickel sulfamate plating solution (NS-160 produced by SHOWA CHEMICAL CO., LTD.) for 90 minutes to form an electroformed film 8 (see FIG. 8E). The electroforming bath conditions are as follows:

Nickel sulfamate: 600 g/L
Boric acid: 40 g/L
Surface active agent (sodium lauryl sulfate): 0.15 g/L
Temperature of solution: 55° C.
P.H: 4.0
Current density: 20 A/dm$^2$ The electroformed film 8 had a thickness of 300 μm. Thereafter, the electroformed film 8 was stripped from the resist original disk. As a result, a stamper 30 including the conductive film 6, the electroformed film 8 and the resist residue was obtained (see FIG. 5F).

The resist residue is removed by using the oxygen plasma ashing method. As for the oxygen plasma ashing, plasma ashing was conducted in a chamber which is filled with oxygen gas at a rate of 100 ml/min and which is adjusted to a vacuum of 4 Pa, at 100 W for 20 minutes (not illustrated). The father stamper 30 including the conductive film 6 and the electroformed film 8 was obtained. Thereafter, an unnecessary part of the resultant stamper 30 is stamped out by a metal blade, resulting in an imprinting stamper 30.

The stamper 30 was subjected to ultrasonic cleaning with acetone for 15 minutes. Thereafter, in order to increase the mold release property at the time of imprinting, the stamper 30 is immersed in a solution obtained by diluting fluoroalkylsilane [CF$_3$(CF$_2$)$_7$CH$_2$CH$_2$Si (OMe)$_3$] (TSL8233 produced by GE TOSHIBA SILICONES) to 5% with ethanol, for 30 minutes. After the solution is blown off by a blower, annealing is conducted at 120° C. for one hour.

On the other hand, a magnetic recording layer 12 was formed on a 0.85 inch torus-shaped glass substrate 10 by using the sputtering method as a substrate to be patterned. A novolac resist 14 (S1801 produced by ROHM AND HAAS ELECTRONIC MATERIALS) was spin-coated on the magnetic recording layer 12 at the number of rotations of 3,800 rpm (see FIG. 9A). Thereafter, a pattern is transferred onto the resist 14 by pressing the stamper 30 with 2,000 bar for one minute (see FIG. 9B). The resist 14 having the transferred pattern was exposed to UV (ultraviolet rays) for five minutes, and then heated at 160° C. for 30 minutes.

Oxygen RIE was conducted on the substrate imprinted 10 as heretofore described under an etching pressure of 2 mTorr by using an ICP (inductively coupled plasma) etching system (see FIG. 9C). Subsequently, the magnetic recording layer 12 was etched using Ar ion milling (see FIG. 9D). After the magnetic recording layer 12 was etched, oxygen RIE was conducted with 400 W and 1 Torr in order to strip the etching mask 14a formed of the resist (see FIG. 9E). After the etching mask 14a was stripped, a DLC (Diamond Like Carbon) film having a thickness of 3 nm is formed as a protection film 16 by using the CVD (chemical vapor deposition) (see FIG. 9F). In addition, a lubricant is applied to have a thickness of 1 nm by using the dipping method.

The medium thus imprinted and patterned were incorporated into a magnetic recording apparatus to detect a signal. As a result, a favorable burst signal was obtained, and head position control could be conducted suitably.

SECOND EXAMPLE

A manufacturing method of a magnetic recording medium according to a second example of the present invention will now be described with reference to FIGS. 10A to 10D. The magnetic recording medium manufactured by using the manufacturing method of the present example is a substrate-patterned magnetic recording medium.

First, an imprint stamper is fabricated by using a technique similar to that shown in FIGS. 8A to 8G, and especially by using the lithography method according to the first embodiment in FIG. 8B.

Figure 10A:
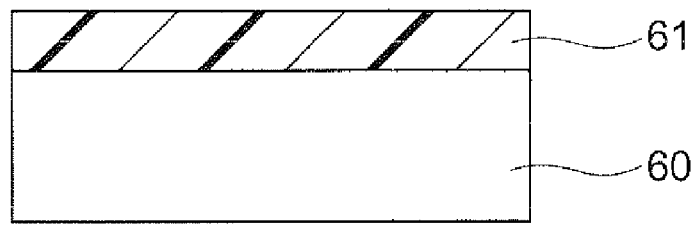
FIGS. 10A to 10D are sectional views showing manufacturing processes of a bit-patterned magnetic recording medium of substrate-patterned type.
Figure 10B:
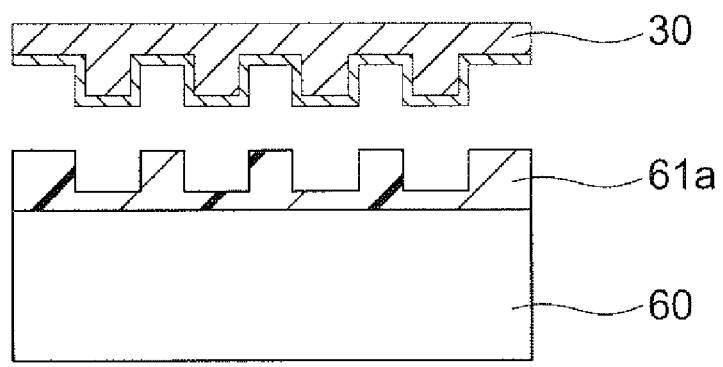
Figure 10C:
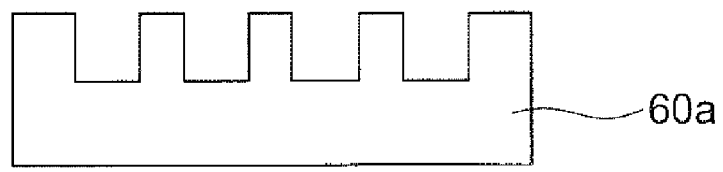

Subsequently, a concave-convex patterned substrate is fabricated by using the imprint lithography method as described hereafter. As shown in FIG. 10A, a resist 61 for imprinting is applied onto a substrate 60. Subsequently, as shown in FIG. 10B, a stamper 30 is opposed to the resist 61 on the substrate 60. Pressure is applied to press the stamper 30 against the resist 61 to transfer a convex part pattern on the surface of the stamper 30 onto the surface of the resist 61. Thereafter, the stamper is removed. As a result, a concave-convex pattern is formed on the resist 61, resulting in a resist pattern 61a (see FIG. 10B).

Subsequently, the substrate 60a having the concave-convex pattern formed thereon is obtained by etching the substrate 60 with the resist pattern 61a used as a mask. Thereafter, the resist pattern 61a is removed (see FIG. 10C).

Figure 10D:
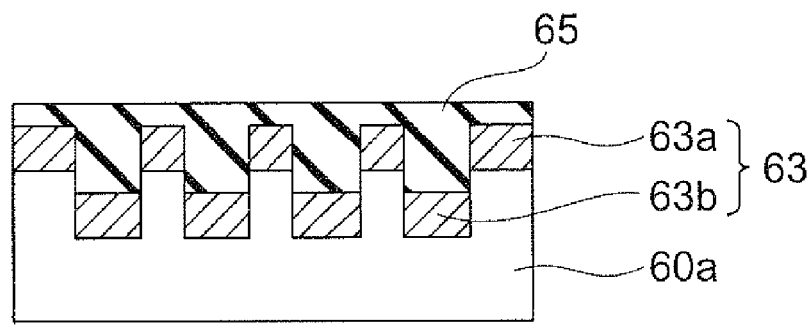

Subsequently, as shown in FIG. 10D, a magnetic film 63 formed of a material suitable for perpendicular recording is formed on the substrate 60a. At this time, a magnetic film 63 formed on convex parts of the substrate 60a becomes a convex part magnetic substance part 63a, and a magnetic film formed on concave parts of the substrate 60a becomes a concave part magnetic substance part 63b. It is desirable to form a laminated film of a soft magnetic underlying layer and a ferromagnetic recording layer as the magnetic film 63. In addition, a protection film 65 formed of carbon is provided on the magnetic film 63 and a lubricant is applied to fabricate a magnetic recording medium.

The medium thus imprinted and patterned were incorporated into a magnetic recording apparatus to detect a signal.

As a result, a favorable burst signal was obtained, and head position control could be conducted suitably.

According to the original disk fabrication method according to one embodiment of the present invention, it becomes possible to fabricate a bit-patterned magnetic recording medium which has a high recording density and which makes favorable address deciphering possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An original disk fabrication method for irradiating a photosensitive resin film with an electron beam to draw a pattern and fabricating a stamper to be used to form a pattern on a magnetic recording medium, the electron beam irradiating apparatus including a rotating mechanism configured to rotate a stage on which a substrate is placed, and a blanking drive part configured to control blanking of the electron beam, the method comprising:

irradiating the electron beam by using a plurality of blanking signals every rotation of the stage per bit unit, when drawing the pattern in a part corresponding to an address part on the photosensitive resin film.

2. A manufacturing method of a magnetic recording medium comprising:

fabricating an original disk by using an original disk fabrication method according to claim 1, and
   manufacturing a magnetic recording medium by using the original disk.

3. An original disk fabrication method for irradiating a photosensitive resin film with an electron beam to draw a pattern by means of an electron beam irradiating apparatus and fabricating a stamper to be used to form a pattern on a magnetic recording medium including at least an address part and a data part, the electron beam irradiating apparatus including a rotating mechanism which rotates a stage on which a substrate is placed, and a blanking drive part which controls blanking of the electron beam, the method comprising:

drawing a pattern in each of the address part and the data part so that one signal output unit of ON/OFF of the blanking signal in a region corresponding to the address part is made in pattern drawing larger than one signal output unit in a region corresponding to the data part, when the calculation processing apparatus accompanying a blanking signal source calculates blanking signal output.

4. The method according to claim 3, wherein one signal output unit of ON/OFF of the blanking signal in the region corresponding to the address part is a plurality of times one signal output unit in the region corresponding to the data part.

5. A magnetic recording medium of patterned media type comprising:

a data part divided in a concentric circle form; and
   an address part arranged so as to stride across the data part,
   wherein a line pitch of the lines in a radial direction in the data part is shorter than a line pitch of the lines in the radial direction in the address part.

6. The medium according to claim 5,
   wherein the line pitch of the lines in the radial direction in the data part is half of the line pitch of the lines in the radial direction in the address part.

7. A magnetic recording medium of patterned media type comprising:

a data part arranged in a concentric circle form; and
   an address part arranged so as to stride across the data part,
   wherein a pattern width of a non-magnetic line in a radial direction in the data part is shorter than a pattern width of a non-magnetic line in the radial direction in the address part.

* * * * *